(12) United States Patent
Nagao

(10) Patent No.: US 6,767,676 B2
(45) Date of Patent: Jul. 27, 2004

(54) OPTICAL FUNCTIONAL ELEMENT AND METHOD OF PRODUCING THE SAME

(75) Inventor: Kimitoshi Nagao, Kanagawa (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/396,504

(22) Filed: Mar. 26, 2003

(65) Prior Publication Data

US 2003/0186139 A1 Oct. 2, 2003

(30) Foreign Application Priority Data

Mar. 26, 2002 (JP) ........................................ 2002-085851
Aug. 7, 2002 (JP) ........................................ 2002-229702

(51) Int. Cl.⁷ .............................. G03C 5/26; G03C 5/50; G03F 7/27
(52) U.S. Cl. .............................. 430/11; 430/13; 430/15; 430/18; 430/290; 430/292; 430/321; 430/328; 430/407; 430/409
(58) Field of Search .............................. 430/11, 13, 15, 430/18, 290, 292, 321, 328, 407, 409

(56) References Cited

U.S. PATENT DOCUMENTS 4,863,819 A * 9/1989 Drexler et al. ................ 430/14

FOREIGN PATENT DOCUMENTS

JP                272566 A       10/2001

* cited by examiner

Primary Examiner—John A. McPherson
Assistant Examiner—Amanda Walke
(74) Attorney, Agent, or Firm—Sughrue Mion, PLLC

(57) ABSTRACT

The optical functional element contains aggregates of developed silver grains obtained by developing silver halide grains arranged so as to constitute a periodical structure. The element includes a substrate and a medium layer. The aggregates of the developed silver grains are arranged in the medium layer so as to constitute said periodical structure. The element is produced by first selectively exposing a photo-curing resin layer formed on said substrate in which the silver halide grains are dispersed so as to selectively photo-cure the photo-curing resin layer, then overall exposing the photo-curing resin layer to expose the silver halide grains in the photo-curing resin layer, and thereafter developing the photo-curing resin layer.

15 Claims, 3 Drawing Sheets

OPTICAL FUNCTIONAL ELEMENT AND METHOD OF PRODUCING THE SAME

BACKGROUND OF THE INVENTION

1. Field of the Invention

The present invention relates to an optical functional element of a structure, generally called a photonic crystal (hereinafter, referred to simply as "photonic crystal"), in which plural media with different refractive indices are periodically arranged.

The present invention also relates to a method of producing the optical functional element (photonic crystal).

2. Related Background Art

Photonic crystals have artificial one- or multi-dimensional periodical structures (one-, two-, and three-dimensional) having similarities to solid crystals. More specifically, they have plural media with different refractive indices which are periodically arranged.

Conventional methods for fabricating photonic crystals of this type having plural media with different refractive indices which are periodically arranged include various methods, for example, dry etching, wet etching, fusion-lamination, sputtering, manipulation, self organization, application of lithography, etc.

However, the various conventional methods described above generally involve complicated processes and take a relatively long period of time. In addition, no simple method for fabricating two- or three-dimensional photonic crystals in particular has been known. The various methods described above are based on production technologies for semiconductors so that there is the problem in that it is difficult to use them to fabricate photonic crystals of a large area. Furthermore, another problem is that there are limitations on patterns that can be fabricated by such methods.

Basic properties and examples of operation of photonic crystals as well as conventional fabrication methods for photonic crystals are as described in JP 2001-272566 A entitled "Method for Manufacturing Photonic Crystal" and detailed description will be omitted here.

SUMMARY OF THE INVENTION

The present invention has been made under the above-mentioned circumstances, and a first object of the present invention is to solve the problems with the conventional technologies and to provide an optical functional element which is a photonic crystal of a structure having plural media with different refractive indices periodically arranged therein.

A second object of the present invention is to provide a method of producing the optical functional element.

Other objects of the present invention will be apparent from the following description.

In order to attain the above-mentioned first object, a first aspect of the present invention provides an optical functional element comprising an aggregate of developed silver grains obtained by developing silver halide grains arranged so as to constitute a periodical structure. That is to say, the optical functional element of the present invention is a photonic crystal has such a feature that an aggregate of silver grains obtained by developing silver halide grains are arranged so as to constitute a periodical structure.

Here, the photonic crystal of the present invention has the following feature. That is, a photo-curing resin layer formed on a substrate in which silver halide grains are dispersed is first selectively exposed to radiation and then overall exposed to light to develop the silver halide grains dispersed in the photo-curing layer thereby forming an aggregate of developed silver arranged so as to construct the above-mentioned periodical structure.

In the photonic crystal of the present invention, the photo-curing resin layer in which silver halide grains are dispersed consists of a single layer or of plural layers. Where it consists of plural layers, it is preferred that an intermediate layer containing no silver halide grain be provided between any adjacent two of such layers.

Further, the photonic crystal of the present invention includes developing a material having a structure composed of a substrate, a binder layer on the substrate containing dispersed silver halide grains therein, and a photo-curing resin layer on at least one side of the binder layer by selectively exposing the photo-curing resin layer to radiation and then subjecting it to overall exposure to light to form an aggregate of developed silver which are arranged to construct the above-mentioned periodical structure.

The present invention can also provide an effective method for producing the above-mentioned photonic crystals. That is, the present invention can provide a method for producing a photonic crystal, comprising exposing and then selectively developing silver halide grains dispersed in a photo-curing resin layer formed on a substrate to form an aggregate of silver grains which are periodically arranged in the photo-curing resin layer.

Here, the above-mentioned photo-curing resin layer is preferably one to which infiltrating power (infiltrability) of a developer which develops the silver halide grains varies depending on the degree of photo-curing. Alternatively, the photo-curing resin layer is preferably one to which infiltrability of the developer varies by selective irradiation of the photo-curing resin layer with radiation.

Another effective method as a production method for photonic crystals is a method including developing a material having a structure composed of a substrate, a binder layer on the substrate containing dispersed silver halide grains therein, and a photo-curing resin layer on at least one side of the binder layer by selectively exposing the photo-curing resin layer to radiation and then subjecting it to overall exposure to light to form the aggregate of developed silver which are periodically arranged.

Still another effective method as a production method for photonic crystals is a method which comprises returning the photonic crystal formed as described above to the step of coating a photo-curing resin layer and again producing a single layer or plural layers of photonic crystal lattice on the previously fabricated single layer or plural layers of photonic crystal lattice on the photonic crystal. On this occasion, use of different lattice masks for the initial single layer or plural layers of photonic crystal lattice and for the single or plural layers of photonic crystal lattice formed so as to overlap the former enables fabrication of photonic crystals composed of multi-layer lattices with different angles.

In short, the method for producing a photonic crystal according to the present invention is just needed to form a periodical structure, by a difference in refractive index, between a region where developed silver exists and another region where no developed silver exists. No limitation is posed on its layer structure and lattice pattern, thus giving much freedom in choice.

DESCRIPTION OF THE PREFERRED EMBODIMENTS

Hereinafter, the optical functional element and method of producing the optical functional element of the present invention will be described in detail with reference to preferred embodiments shown in the attached drawings.

Figure 1:
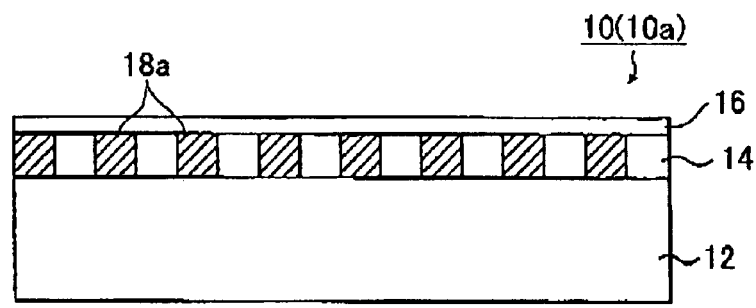
FIG. 1 is a cross-sectional view showing the construction of a two-dimensional lattice photonic crystal of a single layer structure according to an embodiment of the present invention.

FIG. 1 is a cross-sectional view showing the structure of a two-dimensional lattice photonic crystal comprising a single layer, which is an embodiment of the optical functional element (hereinafter, referred to simply as "photonic crystal") according to the present invention. The photonic crystal 10 shown in FIG. 1 includes a photonic crystal production material 10a having a photo-curing resin layer 14 obtained by dispersing silver halide grains on a substrate 12 and a protective layer 16 provided on the upper side of this layer (see FIG. 3), with the resin layer 14 containing developed silver 18a periodically formed by subjecting the material 10a to predetermined processing steps such as exposure and development.

Figure 2A:
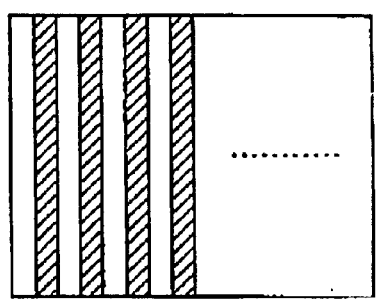
FIGS. 2A and 2B are each a plan view showing details of a two-dimensional lattice photonic crystal of a single layer structure according to an embodiment of the present invention.
Figure 2B:
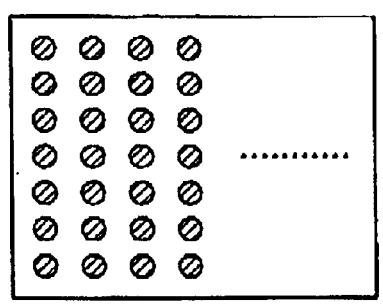

In FIG. 1, which is a cross-sectional view and might be a little difficult to understand, for example, a unidirectional lattice pattern by lines (see the plan view in FIG. 2A), a bidirectional lattice pattern by dots (see the plan view in FIG. 2B), or the like is formed as a periodical arrangement pattern formed by developed silver 18a in a photo-curing resin layer 14.

Hereinafter, the production process of the above-mentioned photonic crystal 10 that is an example of the method of producing the optical functional element according to the present invention will be described in detail with reference to FIGS. 3 to 5.

Figure 3:
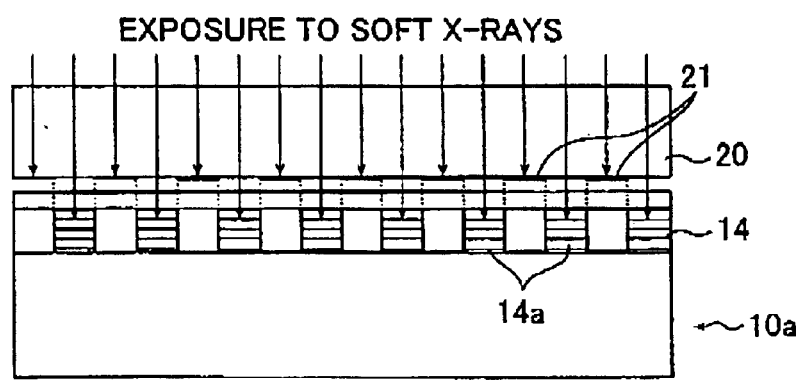
FIG. 3 is a diagram illustrating an exposure step which performs a predetermined exposure to a photonic crystal production material according to one embodiment of the present invention.
Figure 4:
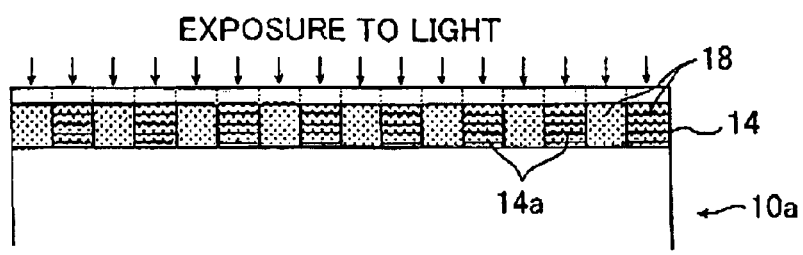
FIG. 4 is a diagram illustrating exposure to light of silver halide grains dispersed in a photo-curing resin layer according to one embodiment of the present invention.

FIGS. 3 and 4 are diagrams illustrating exposure steps for performing predetermined exposure to a material for producing a photonic crystal (hereinafter, referred to as "photonic crystal production material") 10a. First, as shown in FIG. 3, a photomask 20 patterned (21) with a material which does not permeate soft X-rays or ultraviolet rays is contacted on the photonic crystal production material 10a and uniform soft X-rays or ultraviolet rays are irradiated from above to expose a predetermined pattern on the photonic crystal production material 10a (in actuality, on its photo-curing resin layer 14).

Here, the "pattern" is to realize arrangement of the developed silver 18a (see FIG. 1) having a size necessary for realizing the action of light in accordance with the purpose of fabricating the photonic crystal 10 and must be set in consideration of unavoidable errors (errors in size) which would be generated in the course of processing.

This exposure results in curing of the exposed part of the photo-curing resin layer 14 (photo-curing: the part indicated by the reference numeral 14a). Although not shown, silver halide grains 18 (see FIG. 4) are uniformly dispersed in the photo-curing resin layer 14.

The pattern constructed by the cured part 14a and non-cured part (part other than the part 14a) of the obtained photo-curing resin layer 14 must give a great difference in infiltration capacity of the developer between these parts in the course of the development process of the silver halide grains 18 described hereinbelow. That is, go/no-go of development of the silver halide grains 18 dispersed in the photo-curing resin layer 14 depends on this difference in infiltration capacity of the developer.

FIG. 4 shows the next step, i.e., exposure to light of the silver halide grains 18 dispersed in the photo-curing resin layer 14. The exposure of the silver halide grains 18 here does not have to be patterned; it is only necessary to perform uniform exposure at a level which is required for forming a desired amount of developed silver 18a. Note that fine dots in FIG. 4 indicate sensitized silver halide grains 18.

Figure 5:
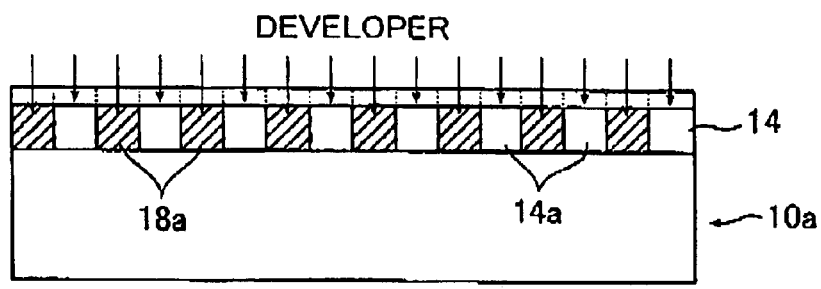
FIG. 5 is a diagram illustrating a development process for silver-halide grains in a photo-curing resin layer uniformly exposed by the step illustrated in FIG. 4.

FIG. 5 is a diagram illustrating the development process of the silver halide grains 18 in the photo-curing resin layer 14 which is uniformly exposed by the step shown in FIG. 4. As shown in FIG. 5, the developer supplied onto the photonic crystal production material 10a hardly infiltrates into the cured part 14a of the photo-curing resin layer 14 while it readily infiltrates into the non-cured part (part other than the part 14) thereof.

As a result, the exposed silver halide grains 18 dispersed in the non-cured part of the photo-curing resin layer 14 are developed immediately. On the other hand, the silver halide grains 18 dispersed in the cured part 14a, though exposed, are not developed here, or even if they are developed, there will be a significant difference in the number of developed silver halide grains 18 as compared with the cured part 14a. The above-mentioned silver halide grains 18 which remain undeveloped are substantially transparent and give not so great an influence to the behavior of light transmitted into the photo-curing resin layer 14. Accordingly, such silver halide grains 18 may remain unremoved in the photo-curing resin layer 14.

A protective layer 16 which is an uppermost layer of the photonic crystal production material 10a is basically there to prevent damages of the photo-curing resin layer 14, which is a main component of the photonic crystal production material 10a. It is also possible that the protective layer 16 itself is made of a photo-curing resin in order to more distinctly separate the go/no-go of infiltration of a developer at the time of development.

Note that the photonic crystal production material 10a can be produced by a method of coating a photo-curing resin layer 14 in which silver halide grains are uniformly dispersed and optionally a protective layer 16 to be provided thereon on a substrate 12 either successively or simultaneously, or the like method.

In the present embodiment, a photonic crystal 10 can be produced by the simple production process as described above. The obtained photonic crystal 10 has a characteristic, lattice-like structure in which, for example, developed silver grains 18a are periodically arranged as described above.

Figure 6:
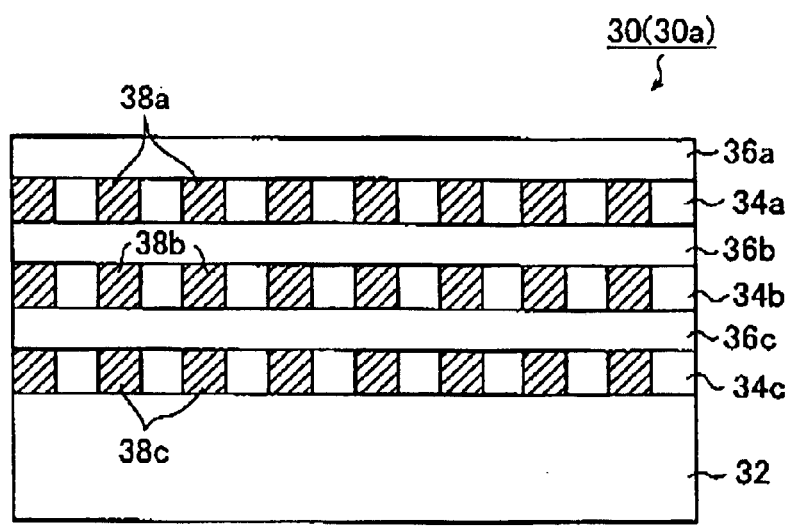
FIG. 6 is a cross-sectional view showing the construction of a photonic crystal according to another embodiment of the present invention.

FIG. 6 is a cross-sectional view showing the structure of a photonic crystal 30 which is one embodiment of the optical functional element according to the present invention. A photonic crystal production material 30a includes a substrate 32 having thereon three photo-curing resin layers 34a, 34b, and 34c in which silver halide grains are dispersed, a protective layer 36a provided on the upper side of the uppermost layer 34a, and intermediate layers 36b and 36c provided between the photo-curing resin layers 34a and 34b and between the photo-curing layers 34b and 34c, respectively. The photonic crystal 30 according to the present embodiment in which developed silver 38a, 38b, and 38c is periodically formed in the resin layers 34a, 34b, and 34c is obtained by subjecting the material 30a to predetermined processing steps such as exposure and development.

The above-mentioned intermediate layers 36b and 36c form distinct interfacial boundaries between the photo-curing resin layers 34a and 34b and between the photo-curing resin layers 34b and 34c, respectively, so that the periodical patterns of the developed silver 38a, 38b, and 38c formed in the photo-curing resin layers 34a, 34b, and 34c, respectively, can be more distinctly separated among the respective layers.

Here, as the arrangement of developed silver 38a, 38b, and 38c periodically formed in the above-mentioned three photo-curing resin layers 34a, 34b, and 34c, respectively, for example, lattice-like patterns by lines, lattice-like patterns by dots, and the like as described above may be used.

The method for forming periodical patterns by developed silver 38a, 38b, and 38c in the photo-curing resin layers, respectively, in the photonic crystal 30 according to the present embodiment is substantially the same as that in the embodiment illustrated in FIGS. 3 to 5 even when the photonic crystal 30 according to the present embodiment is of a three layer structure, so that detailed description thereof will be omitted here. The same production method as in the case of a single layer structure can be used even for a multi-layer structure, which is a great advantage of the production method according to the present invention.

In the above-mentioned embodiment, the example in which silver halide grains which will be converted into silver grains upon development are dispersed in a photo-curing resin is shown. However, in another example of the photonic crystal of the present invention, silver halide grains are dispersed in a resin having no photocurability as a binder and instead intermediate layers sandwiching the resin layer having dispersed therein the silver halide grains are composed of photo-curing resin layers having a thickness a little greater than that of the ordinary intermediate layers.

Figure 7:
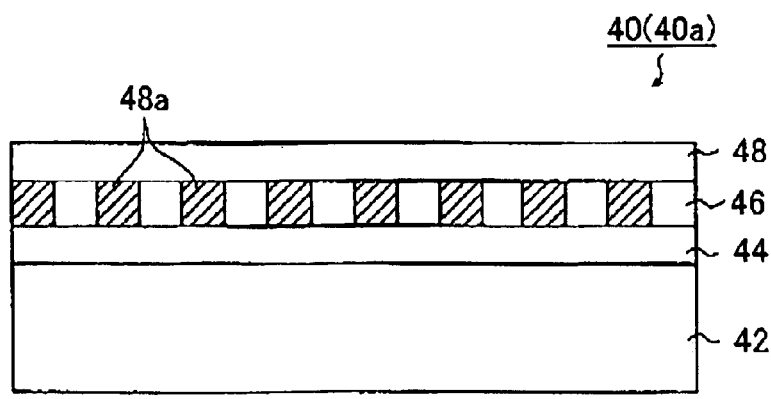
FIG. 7 is a cross-sectional view showing the construction of a photonic crystal according to still another embodiment of the present invention.

That is, as shown in FIG. 7, a photonic crystal 40 according to the present embodiment includes a photonic crystal production material 40a having a substrate 42 having thereon a non-photo-curing resin layer 46 in which silver halide grains are dispersed, photo-curing protective layers 44 and 48 provided on upper and lower sides of the resin layer 46, with developed silver 48a being periodically formed in the resin layer 46 by subjecting the material 40a to predetermined processing steps such as exposure and development.

The production process for the photonic crystal 40 with the photonic crystal production material 40a according to the present embodiment is substantially the same as the production process for the photonic crystal 10 or 30 with the photonic crystal production material 10a or 30a as described above, so that description of details thereof will be omitted here.

In the present embodiment, not only does the produced photonic crystal has characteristics equal to those described in the respective embodiments, but also non-photo-curing resin layers can be used as binder layers in which silver halide grains are dispersed, so that an advantage that freedom in choice of resin materials is broadened can be obtained.

Figure 8:
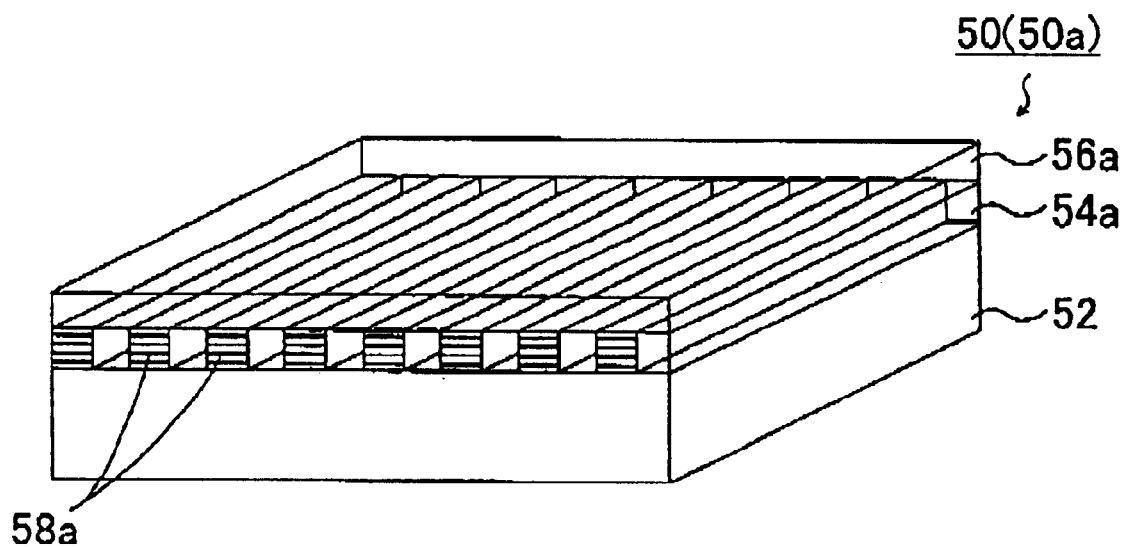
FIG. 8 is a perspective view showing a state in which a first layer is formed in a production process for a photonic crystal according to another embodiment of the present invention.
Figure 9:
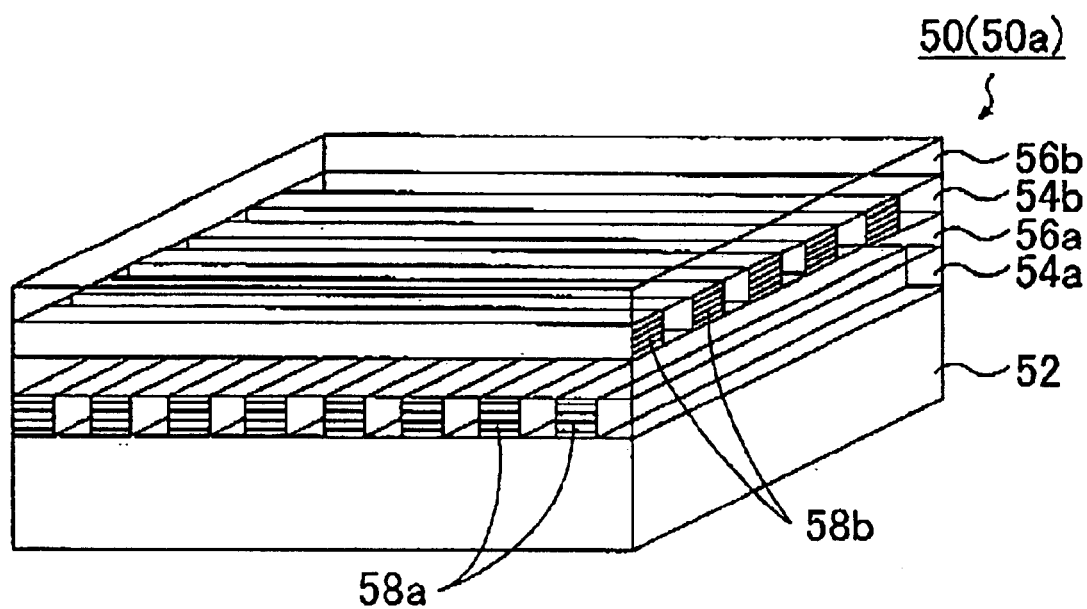
FIG. 9 is a perspective view showing a state in which a second layer of the photonic crystal according to the embodiment shown in FIG. 8 is formed.

FIGS. 8 and 9 are perspective views showing structures of photonic crystals 50 according to still another embodiment of the present invention. In the photonic crystal 30 of a multi-layer structure shown in FIG. 6, the same periodical patterns (unidirectional lattice-like patterns) are formed in respective layers so that they overlap each other completely. On the contrary, the feature of the photonic crystal 50 according to the present embodiment is that periodical patterns whose directions are different from each other are formed in adjacent layers as shown in FIG. 9.

The photonic crystal 50 according to the present embodiment can be produced by the production method as shown in previous embodiments (see FIGS. 3 to 5). That is, after a photonic crystal composed of a first layer (or first multi-unit layer) is formed, another photo-curing resin layer in which silver halide grains are uniformly dispersed is again formed by, for example, coating (optionally through an appropriate intermediate layer) or the like, in such a manner that in the second photo-curing resin layer, a periodical pattern can be formed in a direction which differs from that of the periodical pattern formed in the first layer.

That is, the present embodiment makes it possible to form periodical patterns in different-directions or the like in the photonic crystal 50 which includes separately formed photo-curing resin layers 54a and 54b, each having uniformly dispersed therein silver halide grains by the above-mentioned method. This type of periodical patterns cannot be formed with a simple multi-unit layer. By the method of the present embodiment, for example, a periodical pattern (say, a secondary pattern), the direction of which is perpendicular to that of a periodical pattern formed in a first layer (say, a primary pattern), can be formed in a second layer as shown in FIG. 9.

More particularly, with a photonic crystal production material 50a produced by a method of coating a photo-curing resin layer 54a in which silver halide grains are uniformly dispersed and a layer 56a serving as an intermediate layer provided on the upper side of the layer 54a on a substrate 52 either successively or simultaneously, or the like method, first a unidirectional periodical pattern (the above-mentioned primary pattern) in the form of, for example, parallel lines is formed by developed silver 58a by the method as described above. FIG. 8 shows this situation.

Then, on the so-to-speak primary photonic crystal thus obtained, again a photo-curing resin layer 54b and a layer 56b serving as a protective layer to be provided on the upper side of the layer 54b are formed by a method of coating either successively or simultaneously or the like method.

Then, in the newly formed photo-curing resin layer 54b, a secondary periodical pattern whose direction is perpendicular to that of the above-mentioned primary periodical pattern formed in the primary photonic crystal is formed by developed silver 58b as shown in FIG. 9.

Such periodical patterns in the directions perpendicular to each other cannot be formed on a photonic crystal production material which is formed in advance so as to have a multi-unit layer. It is not possible to form such rectangular periodical patterns until a formation method is used in which a step of forming the photo-curing resin layer 54b on the fabricated primary photonic crystal and subsequent steps are repeated as in the case of the photonic crystal 50 of the present embodiment.

In the above-mentioned embodiments, the periodical patterns of the primary and secondary photonic crystals have been exemplified as periodical patterns in the form of unidirectional parallel lines. However, these patterns may be optionally selected. In addition to the so-called one-dimensional lattice patterns as described above, for example, any desired two-dimensional lattice patterns such as circles, ellipses, squares, rectangles, and polygons or lattice patterns such as arrays of various kinds of dots may be used in any desired combinations.

Furthermore, in the above-mentioned embodiments, the number of photo-curing resin layers (e.g., 54a, 54b) which form different patterns may be two or more. Also, a combination of a multi-unit layer and a single-unit layer may also be adopted. That is, a part of the photo-curing resin layers may be composed of a multi-unit layer which has the same periodical pattern in each unit layer thereof. Furthermore, the fashion of combining lattice patterns may be freely selected; for example, parallel patterns, rectangular patterns, patterns rotated by a desired angle, etc. may be selected.

Hereinafter, the structure and production method for the photonic crystals (optical functional element) of the present invention will be described by referring to specific examples thereof.

First, a photonic crystal production material will be described taking the one used in the first embodiment as an example. In other embodiments, the same will apply.

The photonic crystal production material 10a includes the substrate 12, the photo-curing resin layer 14 in which silver halide grains are dispersed, and the protective layer 16 provided on the upper side of the layer 14 as described above. Typical examples of the photo-curing resin used for the photo-curing resin layer 14 include various kinds of vinyl compounds (radical polymerizable) and epoxy compounds (cation ring-opening polymerizable).

These compounds can form cured products having a crosslinked matrix or can undergo polymerization solidification (polymerization). Specific examples of the vinyl compound include many compounds such as pentaerythritol tetraacrylate, and dipentaerythritol hexaacrylate. Examples of the epoxy compound include many compounds such as glycerol triglycidyl ether. These compounds may be used in combination as appropriate.

To disperse silver halide grains in the above-mentioned photo-curing resins, a method of rendering a compound which forms a photo-curing resin hydrophilic or a method of using a latex or the like to make silver halide grains dispersible in solvents can be used. As the former method, mention may be made of a method of dispersing a dry compound as solid fine particles in a polymer latex as a binder that retains such particles and coating the dispersion on a film as used in a laser exposure thermal development dry imaging film DI-AL for medical imaging manufactured by Fuji Photo Film Co., Ltd. On the other hand, one example of the latter method is a method of adding an epoxy compound, a vinyl compound, or the like to a solvent for silver halide emulsion to form a solvent-based coating composition and coating it on a substrate.

The silver halide grains usable in the present invention are not particularly limited and various kinds of silver halide grains can be used. Their particle size may be optionally determined in relation to the size (lattice period) of a photonic crystal. The size of a photonic crystal is usually about 10 nm to about 1 μm for light (visible light) or about 10 μm to about 10 mm for electromagnetic waves. Therefore, the particle size of the silver halide grains will be about 0.005 μm (5 nm) to about 10 μm.

As the developer for silver halide grains of which infiltrability and diffusibility to the photo-curing resin layer 14 in which the above-mentioned silver halide grains are dispersed is required, developers for general black-and-white photosensitive materials can be used. Specifically, Fine Doll or Super Fine Doll, trade names for products by Fuji Photo Film Co., Ltd., or the like may be suitably used.

As the substrate 12, those materials having smooth surfaces and good flatness such as various kinds of films, resins, glass, metals and further ceramics may be suitably used.

To form a photo-curing resin layer 14 in which the silver halide grains are uniformly dispersed on the substrate 12, use of a coating method, etc. is efficient. However, the present invention is not necessarily limited thereto and other methods may also be used. In making a laminate structure, each layer may be formed either by a so-called successive formation method in which after one layer is formed, then a subsequent layer is formed, or by a multi-layer simultaneous formation method in which plural layers are simultaneously formed.

Any one of the above-mentioned embodiments indicates one example of the present invention; the present invention should not be considered to be limited thereto and it is needless to say that variations and improvements as appropriate may be made so far as they do not depart the scope of the present invention.

For example, in the photonic crystal 30 having the structure shown in FIG. 6, the silver halide grains dispersed in the three photo-curing resin layers 34a, 34b, and 34c may have different color sensitivities, respectively, so that patterns can be fabricated with light having different wavelengths in different layers.

By weakening the degree to which the above-mentioned photo-curing resin layer is cured by light, the go/no-go of infiltration of the developer can be made more flexibly adjustable, so that a sinusoidal periodical pattern by developed silver can be fabricated.

Furthermore, the photonic crystals of the present invention can be fabricated by using a method of forming an image used in the ordinary silver halide photography, that is, a method of selectively exposing silver halide grains with radiation through a lattice-like mask and developing them (optionally fixing them) to form an aggregate of developed silver grains arranged so as to construct the above-mentioned periodical structure.

As described above, according to the present invention, a significant effect can be obtained which is that a photonic crystal (optical functional element) having a structure in which plural media with different refractive indices are periodically arranged and a method of producing it efficiently can be provided.

That is, in the present invention, by utilizing photosensitivity and developability of silver halide, a predetermined pattern is formed by the developed silver. Accordingly, any desired patterns can be fabricated by widely changing the crystal pattern of photonic crystals in order to provide photonic crystals usable in various applications. Therefore, the present invention is effective in enabling fabrication of photonic crystals usable for a wider range of objects.

What is claimed is:

1. An optical functional element comprising aggregates of developed silver grains obtained by developing silver halide grains arranged so as to constitute a periodical structure.

2. The optical functional element according to claim 1, further comprising a substrate and a medium layer,
   wherein said medium layer is such that said aggregates of said developed silver grains are arranged so as to constitute said periodical structure.

3. The optical functional element according to claim 2, wherein said medium layer comprises a first region where said developed silver exists and a second region where no developed silver exists, and forms said periodical structure by a difference in refractive indices between said first region and said second region.

4. The optical functional element according to claim 2, wherein said medium layer is such that said aggregates of said developed silver grains are arranged so as to constitute said periodical structure by first selectively exposing a photo-curing resin layer formed on said substrate in which said silver halide grains are dispersed so as to selectively photo-cure said photo-curing resin layer, then overall exposing said photo-curing resin layer to expose said silver halide grains in said photo-curing resin layer, and thereafter developing said photo-curing resin layer.

5. The optical functional element according to claim 4, wherein said photo-curing resin layer is selectively exposed to radiations or ultraviolet rays.

6. The optical functional element according to claim 4, wherein said photo-curing resin layer is one to which infiltrating power or infiltration capacity of a developer with which said silver halide grains are developed varies depending on the degree of photo-curing or by selectively irradiating radiations or ultraviolet rays.

7. The optical functional element according to claim 4, wherein said photo-curing resin layer comprises a single layer.

8. The optical functional element according to claim 4, wherein said photo-curing resin layer comprises plural layers, and an intermediate layer containing no silver halide grain is provided between adjacent two of said plural layers.

9. The optical functional element according to claim 2, wherein said medium layer is such that said aggregates of said developed silver grains are arranged so as to constitute said periodical structure by first selectively exposing a material having a binder layer on the substrate in which said silver halide grains are dispersed, and a photo-curing resin layer on at least one side of said binder layer so as to selectively photo-cure said photo-curing resin layer, then overall exposing said material to expose said silver halide grains in said binder layer, and thereafter developing said material.

10. The optical functional element according to claim 9, wherein said photo-curing resin layer in said material is selectively exposed to radiations or ultraviolet rays.

11. The optical functional element according to claim 9, wherein said photo-curing resin layer is one to which infiltrating power or infiltration capacity of a developer with which said silver halide grains are developed varies depending on the degree of photo-curing or by selectively irradiating radiations or ultraviolet rays.

12. A method of an optical functional element comprising:
   exposing silver halide grains dispersed in a photo-curing resin layer formed on said substrate; and then
   selectively developing said silver halide grains, thereby forming in said photo-curing resin layer aggregates of developed silver grains which are arranged periodically.

13. The method of an optical functional element according to claim 12, wherein said exposing and said selectively developing of the said silver halide grain comprise:
   first selectively exposing said photo-curing resin layer in which said silver halide grains are dispersed to selectively photo-cure said photo-curing resin layer; then
   overall exposing said photo-curing resin layer to expose said silver halide grains in said photo-curing resin layer; and thereafter
   developing said photo-curing resin layer, thereby forming in said photo-curing resin layer aggregates of developed silver grains which are arranged periodically.

14. The method of the optical functional element according to claim 12, wherein said photo-curing resin layer is one to which infiltrating power or infiltration capacity of a developer with which said silver halide grains are developed varies depending on the degree of photo-curing or by selectively irradiating radiations or ultraviolet rays.

15. A method of an optical functional element comprising:
   first selectively exposing a material having a binder layer on the substrate in which said silver halide grains are dispersed, and a photo-curing resin layer on at least one side of said binder layer so as to selectively photo-cure said photo-curing resin layer; then
   overall exposing said material to expose said silver halide grains in said binder layer, and thereafter
   developing said material, thereby forming in said photo-curing resin layer aggregates of developed silver grains which are arranged periodically.

* * * * *